United States Patent
Li et al.

(10) Patent No.: US 9,795,043 B2
(45) Date of Patent: Oct. 17, 2017

(54) RADIO FREQUENCY SUBSCRIBER DROP UNITS HAVING PRINTED CIRCUIT BOARDS WITH GROUND PLANE LAYERS AND/OR HOUSINGS WITH GROUND WALLS

(71) Applicant: CommScope, Inc. of North Carolina, Hickory, NC (US)

(72) Inventors: Shi Man Li, Mooresville, NC (US); Chi-Min Kang, Touchen, NC (US); Jui-Huang Chung, Taipei (TW)

(73) Assignee: CommScope, Inc. of North Carolina, Hickory, NC (US)

(*) Notice: Subject to any disclaimer, the term of this patent is extended or adjusted under 35 U.S.C. 154(b) by 1 day.

(21) Appl. No.: 14/487,283

(22) Filed: Sep. 16, 2014

(65) Prior Publication Data
US 2015/0130555 A1 May 14, 2015

Related U.S. Application Data

(60) Provisional application No. 61/903,552, filed on Nov. 13, 2013.

(51) Int. Cl.
*H01P 5/12* (2006.01)
*H05K 5/00* (2006.01)
*H05K 9/00* (2006.01)

(52) U.S. Cl.
CPC ........... *H05K 5/0026* (2013.01); *H05K 9/006* (2013.01); *H05K 9/0039* (2013.01); *H04Q 2213/13003* (2013.01)

(58) Field of Classification Search
CPC .... H05K 5/0026; H05K 9/0039; H05K 9/006; H04N 7/16; H04Q 11/00
USPC .......................................... 333/100, 107, 128
See application file for complete search history.

(56) References Cited

U.S. PATENT DOCUMENTS

| | | | |
|---|---|---|---|
| 4,459,568 A * | 7/1984 | Landt | H01P 5/187 333/116 |
| 5,675,300 A * | 10/1997 | Romerein | H01R 13/6658 333/100 |
| 5,864,089 A | 1/1999 | Rainal | |
| 8,235,731 B1 | 8/2012 | Poulsen et al. | |
| 8,915,756 B2 | 12/2014 | Schumacher | |
| 2009/0181635 A1 * | 7/2009 | Yamada | H01P 3/084 455/333 |

* cited by examiner

*Primary Examiner* — Robert Pascal
*Assistant Examiner* — Kimberly Glenn
(74) *Attorney, Agent, or Firm* — Muncy, Geissler, Olds & Lowe, P.C.

(57) ABSTRACT

Radio frequency subscriber drop units include a housing having an input port and an output port and a printed circuit board mounted in an interior of the housing. The printed circuit board includes a dielectric layer, a wiring layer that includes conductive wirings that comprise at least part of a communications path between the input port and the output port that is on a first face of the dielectric layer, and a ground plane layer that includes a conductive ground plane that is on a second face of the dielectric layer.

20 Claims, 6 Drawing Sheets

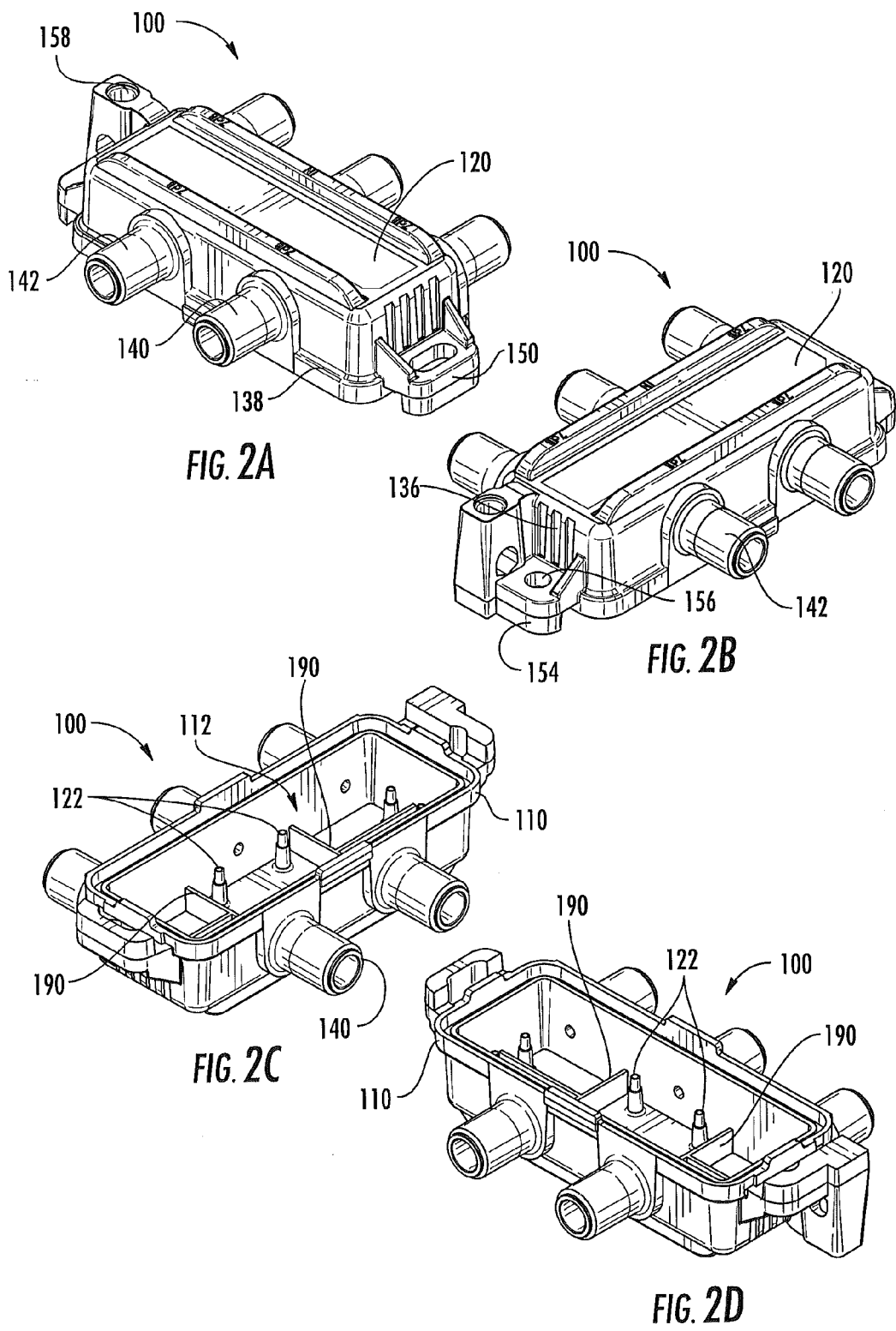

RADIO FREQUENCY SUBSCRIBER DROP UNITS HAVING PRINTED CIRCUIT BOARDS WITH GROUND PLANE LAYERS AND/OR HOUSINGS WITH GROUND WALLS

CROSS-REFERENCE TO RELATED APPLICATION

The present application claims priority under 35 U.S.C. §119 to U.S. Provisional Application Ser. No. 61/903,552, filed Nov. 13, 2013, the entire content of which is incorporated herein by reference as if set forth fully herein.

FIELD OF THE INVENTION

The present invention relates to communications networks and, more particularly, to radio frequency ("RF") subscriber drop equipment that is used, for example, in hybrid fiber-coaxial communications networks.

BACKGROUND

Cable television networks are communications networks that are used to transmit cable television signals and/or other information between one or more service providers and a plurality of subscribers, typically over coaxial and/or fiber optic cables. Most conventional cable television networks comprise hybrid fiber-coaxial networks. In these networks, fiber optic cables are typically used to carry signals from the headend facilities of the service provider to various distribution points, while less expensive coaxial cable may be used, for example, to carry the signals into neighborhoods and/or into individual buildings.

Typically, the service provider is a cable television company that may have exclusive rights to offer cable television services in a particular geographic area. Individuals, corporations and other entities may subscribe with the service provider to have cable television services provided to, for example, homes, apartments, hotels, businesses, schools, government facilities and the like, which are referred to as "subscriber premises." The service provider may broadcast a variety of cable television channels to these subscriber premises over the cable television network. Most cable television service providers also offer other services such as, for example, broadband Internet service and digital telephone service, which services are also provided to the subscribers via the cable television network.

Cable television networks are typically implemented as point-to-multi-point networks in order to deliver "downstream" cable television signals, broadband Internet service and the like from the headend facilities to the subscriber premises. "Upstream" signals from the subscribers to the headend facilities are delivered over the cable television network in the reverse direction. Typically, trunk, district and feeder sections are used to deliver the signals from the headend facilities to individual neighborhoods and the like. So-called "drop sections" are then used to distribute the signals from the feeder sections into the individual neighborhoods.

In the drop sections, tap units are typically connected in series along communications lines (e.g., a coaxial cable) of the cable television network to provide service to individual subscriber premises. The tap units typically have an input port that connects to a first segment of the communications line, an output port that connects to a second segment of the communications line, and one or more RF tap ports. Cables, such as, for example, coaxial cables, may run between each RF tap port of a tap unit and a respective subscriber premise. In this manner, each RF tap port acts as a branch off of the communications line that is used to provide a communications path between the service provider and an individual subscriber premise over the cable television network.

The drop sections of a cable television network may include a variety of different types of equipment, which are generically referred to herein as "RF subscriber drop units." The different types of RF subscriber drop units may include, for example, RF tap units, RF signal amplifiers, RF splitters and directional couplers, MOCA equipment, inline filters and other signal conditioning equipment.

SUMMARY

Pursuant to some embodiments, radio frequency ("RF") subscriber drop units are provided that include a housing having an input port and an output port and a printed circuit board mounted in an interior of the housing. The printed circuit board includes a dielectric layer, a wiring layer that includes conductive wirings that comprise at least part of a communications path between the input port and the output port that is on a first face of the dielectric layer, and a ground plane layer that includes a conductive ground plane that is on a second face of the dielectric layer. The RF subscriber drop unit may be, for example, a splitter or a directional coupler.

In some embodiments, at least one projection may extend from an inner surface of a top wall of the housing. In other embodiments, at least one projection may extend from an inner surface of a side wall of the housing. In either case, the at least one projection may be electrically connected to the ground plane. The conductive ground plane may comprise a first conductive ground plane, and the printed circuit board may further include a second conductive ground plane that is part of the wiring layer. The at least one projection may be, for example, a ground wall that is soldered to the conductive ground plane.

The housing may have a top wall and a plurality of sidewalls that define the interior of the housing. A cover may be provided that is mounted to the sidewalls opposite the top wall to enclose the interior. The wiring layer of the printed circuit board may be adjacent the cover and the ground plane layer of the printed circuit board may be adjacent the top wall.

The conductive ground plane may be configured to reduce signal energy loss between the RF input port and the RF output port. The printed circuit board may be mounted on a plurality of posts that extend from an interior surface of a top wall of the housing, and the RF subscriber drop unit may further include at least one additional projection extending from the top wall of the housing that is directly connected to the conductive ground plane. The at least one additional projection may be, for example, at least one wall or ledge.

In some embodiments, the housing may include a top wall and a plurality of sidewalls that define the interior of the housing, and the at least one projection comprises a ground wall that contacts at least two of the sidewalls.

Pursuant to further embodiments of the present invention, passive RF subscriber drop units are provided that include a housing having an input port and an output port and a printed circuit board that is mounted in an interior of the housing, the printed circuit board including a first face that has a plurality of circuit elements mounted thereon, at least one of which is part of a conductive path that extends from the input port to the output port, and a second face that includes a conductive ground plane.

In some embodiments, a plurality of projections may extend from a top wall of the housing that are electrically connected to the conductive ground plane. The plurality of projections may include at least one wall. The conductive ground plane may be formed of one or more conductive pads that cover at least half the surface area of a ground plane layer of the printed circuit board. The printed circuit board may be a double-sided printed circuit board. The conductive ground plane may be positioned with respect to the conductive path to control an impedance of the conductive path.

Pursuant to still further embodiments of the present invention, radio frequency ("RF") subscriber drop units are provided that include a housing having a top wall and a plurality of sidewalls that define an open interior, an input port that extends from a first sidewall of the housing, an output port that extends from a second sidewall of the housing, a printed circuit board mounted on a plurality of posts that extend downwardly from an interior face of the top wall of the housing into the open interior of the housing, and a ground wall that projects downwardly from the interior face of the top wall, the ground wall extending from the first sidewall to the second sidewall.

In some embodiments, the printed circuit board may include a dielectric layer, a wiring layer that includes conductive wirings that comprise at least part of a communications path between the input port and the output port that is on a first face of the dielectric layer, and a ground plane layer that includes a conductive ground plane that is on a second face of the dielectric layer. The ground wall may be electrically connected to the conductive ground plane.

BRIEF DESCRIPTION OF THE DRAWINGS

FIGS. 2A-2J are various perspective, top, bottom and side views of the RF subscriber drop unit of FIG. 1 with a printed circuit board and a cover thereof removed.

DETAILED DESCRIPTION

Figure 1:
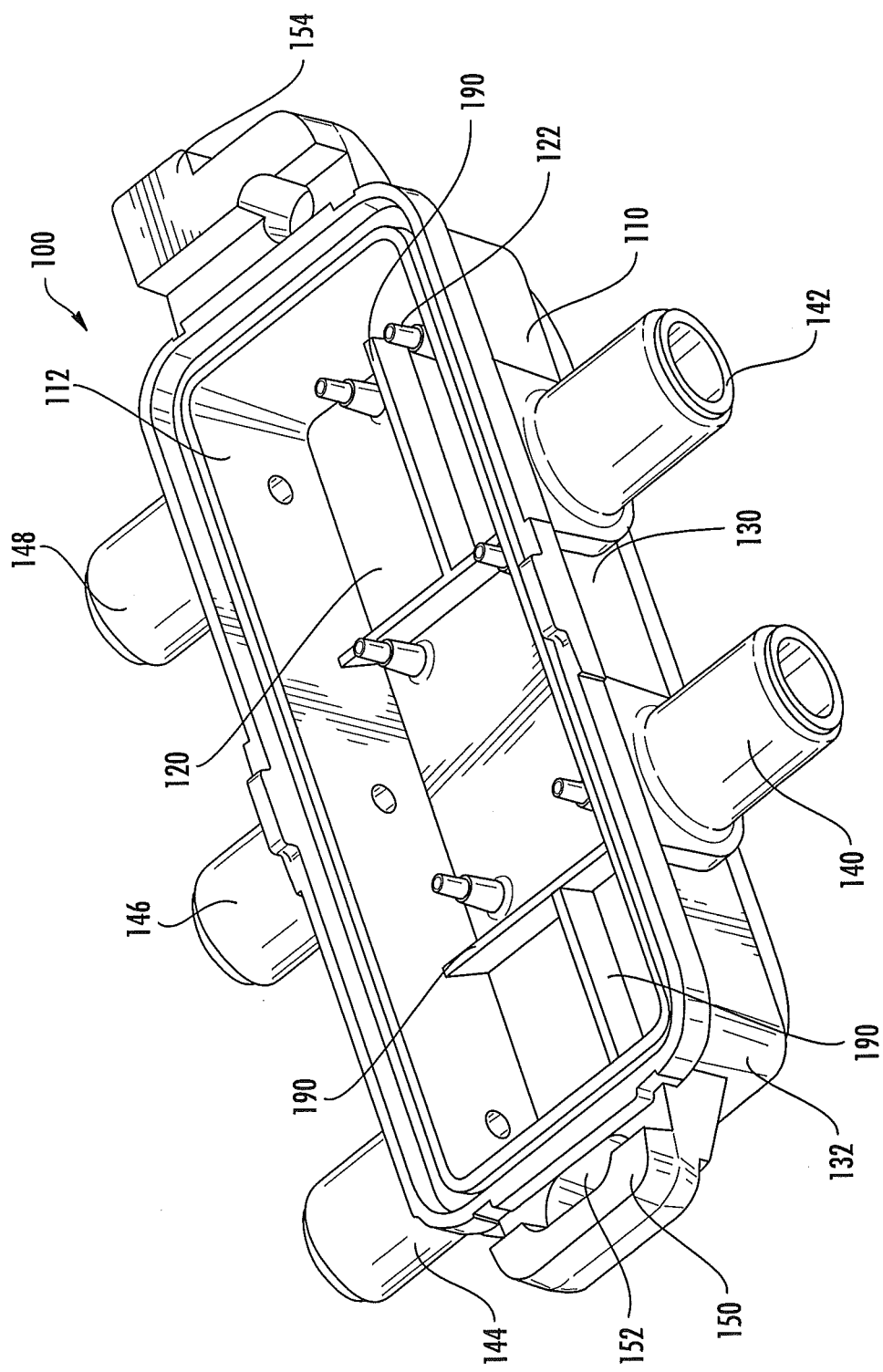
FIG. 1 is a bottom perspective view of an RF subscriber drop unit according to embodiments of the present invention.

As noted above, most hybrid fiber-coaxial cable television networks use RF drop sections that distribute signals between the headend facilities and the subscriber premises over coaxial cables. Unfortunately, signals that are transmitted over coaxial cables at the frequencies used in cable television networks may experience heavy losses if the coaxial cable segments are very long, which is typically the case as subscribers are spread out across metropolitan areas and the suburbs thereof. Additionally, most subscriber premises have multiple RF connector ports (e.g., an RF connector port in the family room of a house, the bedrooms, etc.) so that it is necessary to split the downstream signal a number of different ways (e.g., the downstream signal may be split eight ways to provide the downstream signal to eight different RF connector ports in the subscriber premise). Still further losses may be introduced at each RF subscriber drop unit (e.g., at each tap unit, signal amplifier, splitter, inline filter, etc.) in the form of insertion loss. As is known to those of skill in the art, insertion loss refers to the loss associated with the insertion of an element (e.g., a device) along a transmission line, and may be measured (in dB) as $10*\log_{10}(P_T/P_R)$, where $P_T$ is the power transmitted to the load before insertion of the element along the transmission line and $P_R$ is the power transmitted to the load after insertion of the element along the transmission line. All of the above-described losses may impair the quality of the signals transmitted over the cable television network.

In order to ensure good quality signals, RF signal amplifiers are typically inserted along the coaxial cables of the main communications lines of most cable television networks, and most subscriber premises also include an RF signal amplifier that amplifies the RF signals that are received at the subscriber premise and/or transmitted from the subscriber premise. These RF signal amplifiers may be used to boost the power of the downstream and/or upstream signals in order to maintain an acceptable signal-to-noise ratio along the communications paths between the headend facility and each subscriber premise. However, the use of RF signal amplifiers increases the costs of the network infrastructure, and each RF signal amplifier includes connections that are possible ingress sources for noise into the cable television network, and each RF signal amplifier may also introduce non-linearities in the signals carried over the cable television network that may reduce signal quality.

Pursuant to embodiments of the present invention, RF subscriber drop units are provided that include multi-sided printed circuit boards that have ground planes. These ground planes may help reduce the amount of signal energy that is lost when a signal traverses a communications path on the printed circuit board that connects an input port of the device to an output port of the device. Additionally, the housings of the RF subscriber drop units according to embodiments of the present invention may include ground walls or other conductive projections that provide increased electrical contact between the ground plane on the printed circuit board and the device housing.

The RF subscriber drop units according to embodiments of the present invention may have a housing that has an input port and an output port and a printed circuit board that is mounted in the interior of the housing. The printed circuit board may include a dielectric layer, a wiring layer that is on a first face of the dielectric layer, and a ground plane layer that is on a second face of the dielectric layer. The wiring layer may include conductive wirings that comprise at least part of a communications path between the input port and the output port, while the ground plane layer may include a conductive ground plane. The RF subscriber drop unit may further include at least one projection such as, for example, a downwardly extending interior wall that projects from an inner surface of a top wall of the housing. This projection may be electrically connected to the conductive ground plane and, in some embodiments, may directly contact the conductive ground plane.

The RF subscriber drop units according to embodiments of the present invention may, in some cases, exhibit significantly reduced insertion losses. For example, while a 1×2 RF splitter theoretically would experience an insertion loss of 3 dB (since the signal energy that is received at the input port thereof is split evenly and passed to the two output ports), in practice the insertion loss for conventional 1×2 RF splitters at 1 GHz is typically about 4 dB or more. In contrast, 1×2 RF splitters according to embodiments of the present invention may, for example, exhibit insertion losses of about 3.5 dB or less. As 3 dB of the insertion loss of a 1×2 splitter is inherent in the equal splitting of the input signal, it can be seen that the portion of insertion loss due to losses (e.g., signal reflections, attenuation, etc.) is reduced from about 1 dB to about 0.5 dB. This reduction in the signal losses may be significant, particularly when it is considered that a plurality of RF subscriber drop units such as splitters, filters, tap units drop amplifiers and the like may be interposed between a typical subscriber premise and the feeder sections. A reduction in the insertion loss of 0.5 dB at each such RF subscriber drop unit may result in a significant increase in performance.

Example embodiments of the present invention will now be described with reference to the accompanying drawings.

Figure 2E:
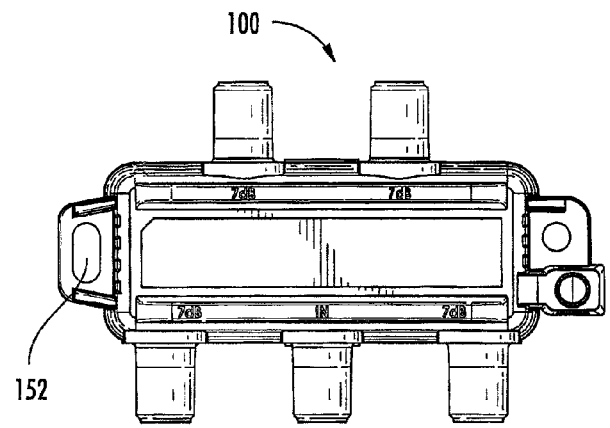
Figure 2F:
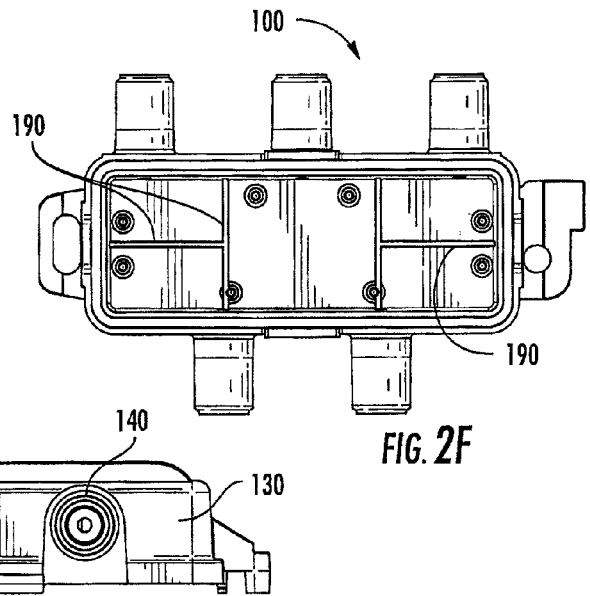
Figure 2G:
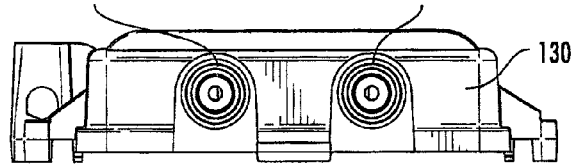
Figure 2H:
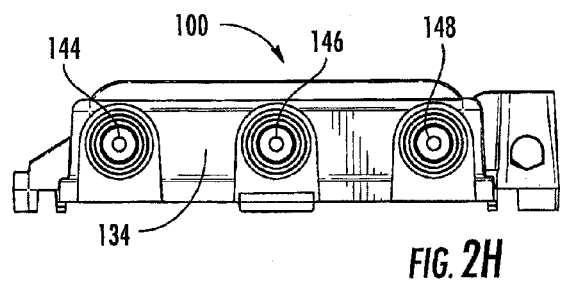
Figure 2I:
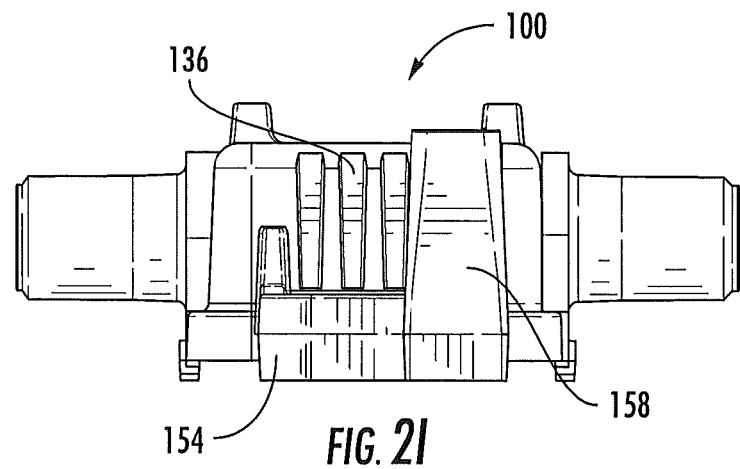
Figure 2J:
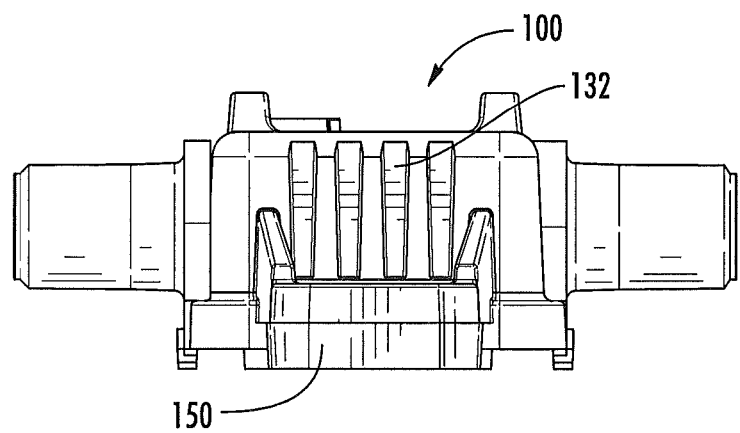
Figure 2K:
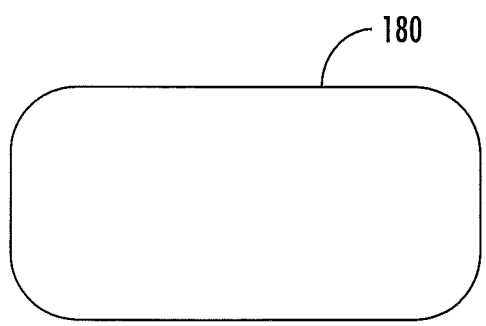
FIG. 2K is a top view of the cover of the RF subscriber drop unit of FIG. 1.
Figure 2L:
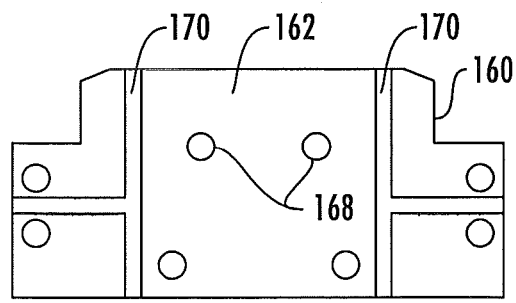
FIG. 2L is a top view of a printed circuit board that is included in the RF subscriber drop unit of FIG. 1.

FIGS. 1 and 2A-L illustrate an RF subscriber drop unit 100 according to certain embodiments of the invention. FIG. 1 is an enlarged, bottom, perspective view of the RF subscriber drop unit 100. FIGS. 2A-2J are various perspective, top, bottom and side views of the RF subscriber drop unit 100. In particular, FIGS. 2A-2B are top perspective views of the RF subscriber drop unit 100, and FIGS. 2C-2D are bottom perspective views of the RF subscriber drop unit 100 with the printed circuit board and cover thereof removed to show the interior of the housing. FIG. 2E is a top view of the RF subscriber drop unit 100 and FIG. 2F is a bottom view of the RF subscriber drop unit 100 with the printed circuit board and cover removed. FIGS. 2G-2H are side views of the RF subscriber drop unit 100, and FIG. 2I-2J are end views of the RF subscriber drop unit 100. Finally, FIG. 2K is a top view of the cover of the RF subscriber drop unit 100 before it has been mounted to the housing, and FIG. 2L is a schematic top view of a printed circuit board that is included in the RF subscriber drop unit 100. The RF subscriber drop unit 100 of FIGS. 1 and 2A-L comprises a five port device that may comprise, for example, a 1×4 RF directional coupler, a 1×4 RF splitter or an RF signal amplifier having a 1×4 RF splitter output. However, it will be appreciated that the RF subscriber drop unit 100 may comprise any other RF subscriber drop unit such as, for example, an RF tap unit, an inline filter, an RF signal conditioning device, etc. It will also be appreciated that the device may include any appropriate number of input ports and output ports.

Referring to FIGS. 1 and 2, the RF subscriber drop unit 100 comprises a housing 110, a cover 180 (see FIG. 2K) and a printed circuit board 160 (see FIG. 2L). The housing 110 may be made of, for example, steel, brass, zinc, aluminum or alloys thereof or metals or metal alloys having similar properties. The housing 110 has a top wall 120 and a plurality of sidewalls 130, 132, 134, 136 that extend downwardly from the top wall 120. The top wall 120 and the sidewalls 130, 132, 134, 136 define an interior cavity 112. The cover 180 may be joined to ends of the sidewalls 130, 132, 134, 136 that are opposite the top wall 120 to fully enclose the interior cavity 112 of housing 110 to protect electronic components that are included therein from moisture or other environmental elements.

An input port 146 in the form of a female coaxial connector port extends through the sidewall 134. First and second output ports 140, 142 in the form of female coaxial connector ports extend through the sidewall 130. Two additional output ports 144, 148 in the form of female coaxial connector ports also extend through the sidewall 134. Each input and output port 140, 142, 144, 146, 148 may include a respective contact structure (not shown) that has a base that extends into the interior cavity 112 of housing 110 to make electrical contact with conductive structures on the printed circuit board 160. A distal end of each contact structure is mounted within the respective input and output ports 140, 142, 144, 146, 148 to make physical and electrical contact with the center conductors of mating coaxial cables that are attached to the ports 140, 142, 144, 146, 148. A first mounting bracket 150 that includes a slot 152 extends from a lower portion of sidewall 132. A second mounting bracket 154 that includes an aperture 156 extends from a lower portion of sidewall 136. A ground block 158 also extends from the sidewall 136.

The housing 110 may be in the shape of a generally rectangular box with an open bottom that receives the cover 180. In the depicted embodiment, the corners of the housing 110 are rounded, but they need not be in other embodiments. The lower portion or "base" of the sidewalls 130, 132, 134, 136 may include an outer lip 138.

As shown in FIGS. 1, 2C-2D and 2F, the housing 110 has an open interior that defines an interior cavity 112. A plurality of protrusions 122 extend downwardly from the interior surface of the top wall 120 (note that in FIGS. 2C-2D and 2F the housing 110 is inverted to illustrate the interior cavity 112). In the depicted embodiment, the protrusions 122 comprise a plurality of posts. In some embodiments, the posts 122 may be hollow and internally threaded. The printed circuit board 160 of FIG. 2L may be mounted via screws (not shown) that are inserted through a plurality of apertures 168 in the printed circuit board 160 and into respective ones of the internally-threaded posts 122. In other embodiments, the posts 122 may be inserted through the apertures 168 in printed circuit board 160 and soldered (instead of screwed) into place. It will be appreciated that the printed circuit board 160 may also be mounted within the interior cavity 112 of housing 110 in other ways such as through the use of mounting tabs that extend from the interior of the sidewalls of the housing 110 or by mounting the printed circuit board 160 on an internal ledge within the housing 110. The printed circuit board 160 may include a ground plane 170 that may be provided on a ground plane layer 162 of the printed circuit board 160. A more detailed description of the printed circuit boards that may be used in the RF subscriber drop units according to embodiments of the present invention is provided below with respect to FIGS. 3A-C, which illustrate a printed circuit board 260 that is similar to the printed circuit board 160, but designed for a 1×2 splitter and hence somewhat simpler and easier to explain.

As shown in FIG. 2K, the RF subscriber drop unit 100 includes a cover 180 that may be attached to the housing 110 via compression press fitting, screws, soldering, welding or the like so that the cover 180 is joined with the housing 110 to fully enclose the printed circuit board 160 that is mounted in the interior cavity 112. Gaskets or other sealing elements (not shown) known to those of skill in the art may be provided between the cover 180 and the housing 110 to ensure that the interior cavity 112 is protected from water or moisture ingress once the cover 180 is joined or otherwise attached to the housing 110. The cover 180 may be a generally flat piece of metal and, in some embodiments, may include apertures (not shown) that serve as screw holes that are used to mount the cover 180 in place onto the housing 110.

The circuitry that may be included on the printed circuit board 160 will be discussed in greater detail below with reference to FIGS. 3A-3C, which illustrate a printed circuit board 260 that is similar to the printed circuit board 160, but which is the printed circuit board for a 1×2 RF subscriber drop unit (which has a simpler layout than the printed circuit board 160 for the 1×4 device of FIGS. 1 and 2A-L). It will be appreciated that the printed circuit board 160 may have the same general layout, circuit elements and functionality as the printed circuit board 260 of FIGS. 3A-3C, but will have additional splitting circuitry in order to provide a 1×4 split. The printed circuit board circuitry is discussed below with reference to the printed circuit board 260 for a 1×2 RF subscriber drop unit in order to simplify the description.

As noted above, FIGS. 3A-3C are various views illustrating a multi-layer printed circuit board 260 for a 1×2 RF subscriber drop unit (not shown) according to embodiments of the present invention. In particular, FIGS. 3A and 3B are plan views of the top and bottom sides, respectively, of the printed circuit board 260, while FIG. 3C is a side view of the printed circuit board 260. The RF subscriber drop unit in which the printed circuit board 260 is mounted may be identical to the RF subscriber drop unit 100 that is discussed above with respect to FIGS. 1 and 2A-L, except that the output ports 144, 148 of the RF subscriber drop unit 100 may be omitted, and the housing 110, the printed circuit board 160 and the cover 180 may be resized accordingly. It will therefore be appreciated that each of the features of the printed circuit board 260 of FIG. 3A-3C that are discussed below may also be included in the printed circuit board 160 that is included in the RF subscriber drop unit of FIGS. 1 and 2A-L. It will also be appreciated that the concepts disclosed herein may be used with a wide variety of different RF subscriber drop units, and that FIGS. 1, 2A-L and 3A-C simply provide examples of different structures in which the concepts of the present invention may be employed. The printed circuit board 260 of FIGS. 3A-C may be mounted via, for example, screws that are inserted through a plurality of apertures 268 in the printed circuit board 260 to, for example, the internally-threaded posts of a housing structure.

Figure 3A:
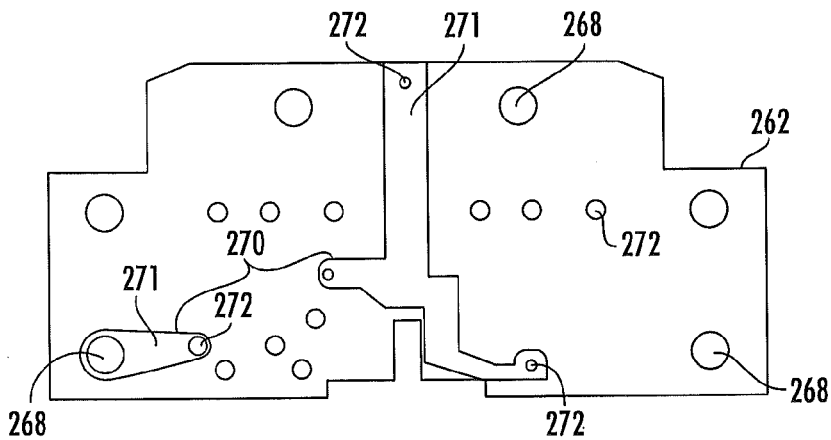
FIGS. 3A and 3B are plan views of the two faces of a printed circuit board that may be included in RF subscriber drop units according to various embodiments of the present invention.
Figure 3B:
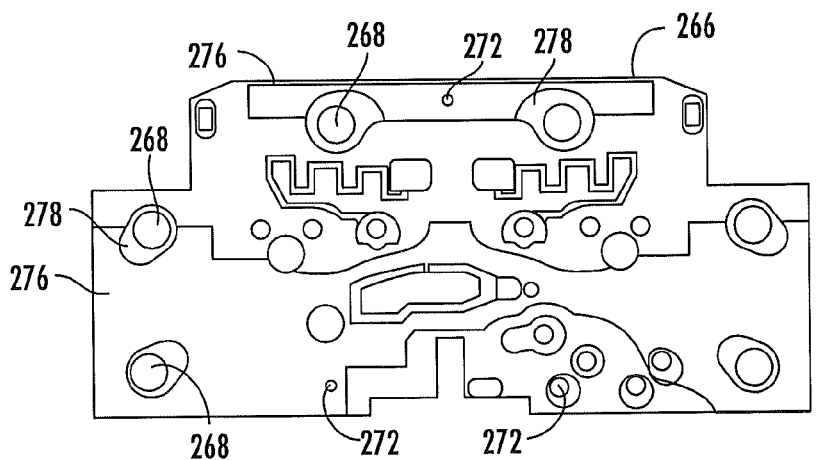
Figure 3C:
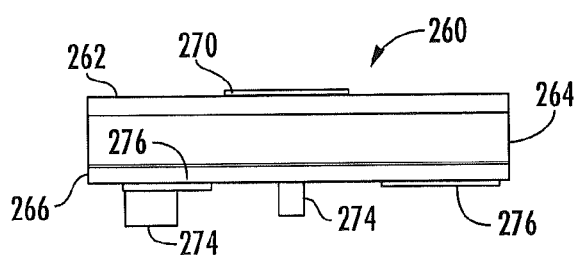
FIG. 3C is a side view of the printed circuit board of FIGS. 3A-3B.

As shown in FIG. 3C, the printed circuit board 260 may be viewed as having three separate layers: namely, a ground plane layer 262, a dielectric layer 264 and a wiring layer 266. The dielectric layer 264 may comprise a dielectric substrate 264 that is formed from, for example, FR-4 or another material that is suitable as a dielectric for a printed circuit board. The ground plane layer 262 may comprise a conductive ground plane 270 that is deposited on a first (top) face of the dielectric substrate 264. Two such conductive pads 271 (which may comprise, for example, copper pads) are illustrated in FIG. 3A. As shown in FIG. 3A, the conductive ground plane 270 may be implemented, for example, as one or more thin conductive pads 271 that are deposited on the top face of the dielectric substrate 264. A number of holes or "vias" 272 are provided that extend through the printed circuit board 260. Some of the vias 272 may be plated with a conductive material and may receive leads of circuit elements 274 (see FIG. 3C) that are mounted on the wiring layer 266 of printed circuit board 260. Other of the vias 272 may be filled with a conductive material and may be used to electrically connect the conductive ground plane 270 of ground plane layer 262 to a conductive ground plane 276 that is provided on wiring layer 266.

As shown in FIG. 3B, the wiring layer 266 may comprise, for example, the conductive ground plane 276 and a plurality of solder points 278 where the circuit elements 274 and/or other structures (e.g., the posts extending downwardly from a top wall of the housing of the RF subscriber drop unit that the printed circuit board 260 is mounted in) are soldered to the printed circuit board 260. The conductive ground plane 276, the solder points 278 and the circuit elements 274 are provided on a second (bottom) face of the dielectric substrate 264 to form the wiring layer 266. A printed circuit board such as the printed circuit board 260 that includes two layers having conductive elements that are separated by a dielectric layer is commonly referred to as a "double-sided" printed circuit board.

The circuit elements 274 on printed circuit board 260 may perform the functionality of the RF subscriber drop unit that the printed circuit board 260 is included in. For example, if the RF subscriber drop unit is a splitter or directional coupler, the printed circuit board 260 may include one or more circuit elements 274 that form one or more signal splitting circuits. These signal splitting circuits may be formed, for example, using transformers and DC blocking capacitors. These splitting circuits may split (or combine in the reverse direction) an input signal in a desired fashion (e.g., into four equal power output signals). In such embodiments, the circuit elements 274 may be electrically connected to each other at the solder points 278 or via conductive traces/pads such that the input port of the device is electrically connected to the output ports and the circuit elements 274 equally split (or unequally split in the case of a directional coupler) the signal energy received at the input port between the output ports. If the RF subscriber drop unit is a signal amplifier, the printed circuit board 260 may include additional circuit elements 274 such as diplexers, power amplifiers, switches, voltage regulators and the like that implement the functionality of an RF signal amplifier. The printed circuit board mounted or implemented circuit elements 274 that implement the functionality of various RF subscriber drop units such as directional couplers, splitters, tap units, signal amplifiers, filters and the like are well known to those of skill in the art, and hence are only generically depicted in the drawings and are not described in any further detail herein.

The conductive ground plane 276 that is provided on the wiring layer 266 may provide a ground reference on the printed circuit board 260 (as some of the circuit elements may have leads that may be electrically connected to a ground reference), and may also act as a shielding structure that reduces unwanted coupling between the circuit elements 274. It has been found that by providing the ground plane 270 on the opposite side of the printed circuit board 260, unwanted coupling can be reduced further, with associated improvement in the insertion loss of the RF subscriber drop unit. The conductive ground plane 270 may also be used to control the impedance of the conductive paths between the input port and output ports of the device, as the impedance of these conductive paths may be impacted by the distance of the conductive paths from the conductive ground plane 270. Thus, the conductive ground plane 270 may be used to reduce coupling between conductive paths (which results in interference and signal loss) and to control the impedance of the conductive paths (thereby reducing reflections and the resulting signal loss therefrom). Accordingly, the conductive ground plane 270 may provide for improved insertion loss performance for the RF subscriber drop unit. While the conductive ground plane 270 is grounded in the depicted embodiment (via electrical connections to the housing, which in turn may be grounded via, for example, a ground block), it will be appreciated that in other embodiments an electrically floating "image" plane that is not electrically grounded may be used instead of the conductive ground plane 270.

FIGS. 3A and 3B provide additional details regarding the printed circuit board 260. As shown in FIG. 3A, in some embodiments, the conductive ground plane 270 may be implemented as one or more conductive pads 271 that are deposited on the top face of dielectric substrate 264 in order to provide the ground plane layer 262. In the depicted embodiment, the conductive ground plane 270 comprises a first conductive pad 271 that primarily extends down the center section of the printed circuit board 260 and a small second conductive pad 271 on the left side of the printed circuit board 260, which together cover less than 10% of the surface area of the top face of dielectric layer 264. However, in other embodiments, the conductive ground plane 270 may cover 30%, 40%, 50% or more of the top face of the dielectric substrate 264. Four of the conductive vias 272 are provided within the footprint of the conductive pads 271 and are used to electrically connect the conductive ground plane 270 of ground plane layer 262 to the conductive ground plane 276 of wiring layer 266.

As shown in FIG. 3B, the bottom face of the printed circuit board 260 includes the ground plane 276, which covers approximately half the surface area of this side of printed circuit board 260. The circuit elements 274 may be mounted in various of the conductive vias 272 to extend downwardly from the bottom face of dielectric layer 264 (see FIG. 3C).

It will also be appreciated that a printed circuit board that includes more than two layers of conductive elements may be provided (e.g., a printed circuit board that has conductive elements deposited on the top side thereof, the bottom side thereof, and in one or more middle layers thereof), and that in such embodiments the conductive ground plane 270 may, for example, be implemented on an internal layer of the printed circuit board.

As noted above, in some embodiments, the conductive ground plane 270 is provided on the top face of the dielectric substrate 264, while the conductive ground plane 276 and the circuit elements 274 are implemented on the bottom surface of dielectric substrate 264 (as is conventional). However, it will be appreciated that in other embodiments the printed circuit board 260 may be inverted so that the conductive ground plane 276 and the circuit elements 274 are implemented on the top face of dielectric substrate 264 and the conductive ground plane 270 is provided on the bottom face of the dielectric substrate 264. It will likewise be appreciated that some of the circuit elements 274 and/or conductive ground plane 276 (or portions thereof) may be implemented on the same face of the dielectric substrate 264 that includes the conductive ground plane 270 in order to take advantage of the provision of a double-sided printed circuit board 260. Implementing circuit elements 274 on both sides of the printed circuit board 260 may allow for the use of a smaller printed circuit board which, in turn, may allow for use of a smaller housing with attendant savings in material costs.

Referring again to FIGS. 1, 2C-2D and 2F, it can also be seen that additional projections 190 in the form of ground walls 190 extend downwardly from the interior surface of the housing 110, and may be formed integrally with the housing 110. These projections 190 may be formed of conductive materials such as the material used to form the housing 110. The projections 190 may be positioned and configured to electrically connect to the ground plane 170 on the ground plane layer 162 of the printed circuit board 160. The projections 190 may be press fit against the conductive ground plane 170 to provide this electrical connection or may be soldered to the conductive ground plane 170. The provision of the projections 190 (which in the depicted embodiment comprise a plurality of ground walls) can significantly increase the surface area of the electrical connection between the conductive ground plane 170 and the housing 110. This may provide an improved ground connection for the printed circuit board 160, which may enhance the insertion loss performance thereof.

The techniques according to embodiments of the present invention may be particularly useful in passive RF subscriber drop products such as splitters, directional couplers, MOCA filters, inline filters, and other signal conditioning devices, as these devices do not include power amplification that may be used to increase the power level of signals traversing the cable television network.

It will be appreciated that numerous modifications may be made to the RF subscriber drop units that are described above that are within the scope of the present invention.

By way of example, while a double-sided printed circuit board 260 is illustrated in FIGS. 3A-3C in other embodiments, a single-sided printed circuit board may be used and the projections 190 may extend through slits or other openings in the printed circuit board to electrically connect with conductive structures on the bottom side of the printed circuit board in order to provide additional ground path connections. Such embodiments may or may not include the conductive ground plane on the single conductive side of the printed circuit board.

As another example, the projections 190 may extend from the cover 180 or from the sidewalls 130, 132, 134, 136 to connect to the conductive ground plane.

As yet another example, the conductive ground plane 270 may be implemented on an interior layer of a printed circuit board. Such an embodiment may be particularly useful in 1×2 splitters and directional couplers, inline filters and the like where the top and bottom layers 262, 266 of the printed circuit board 260 may be used for mounting the circuit elements 274 that implement the functionality of the RF subscriber drop unit, while at least one internal conductive layer (not shown in the drawings) of the printed circuit board 260 is used to implement the conductive ground plane 270. Such a design may allow for the use of smaller printed circuit boards, which may reduce the required size of the device (and hence the material costs of the device). In RF subscriber drop units that have larger number of input and output ports (e.g., 1×4 or 1×8 splitters and directional couplers) the size of the device may be driven by the number of input and output ports as opposed to the size of the printed circuit board, and hence in such devices the increased cost of a printed circuit board having internal conductive layers may not be justified in some applications.

Figure 4:
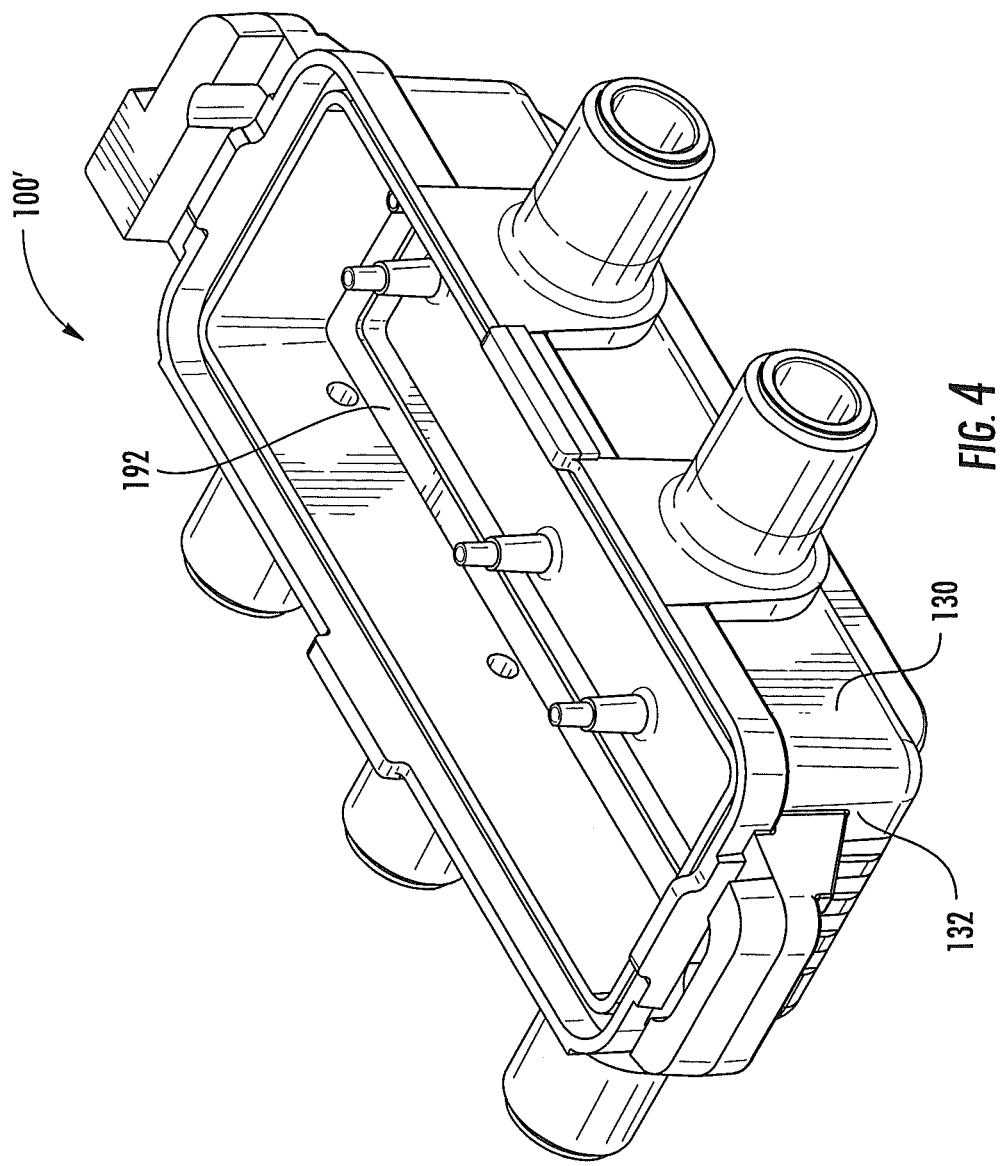
FIG. 4 is a bottom view of an RF subscriber drop unit according to further embodiments of the present invention.

FIG. 4 is a bottom view of an RF subscriber drop unit 100' according to further embodiments of the present invention. As shown in FIG. 4, the RF subscriber drop unit 100' is similar to the RF subscriber drop unit 100 discussed above. However, the ground walls 190 that are included in the RF subscriber drop unit 100 are omitted in the RF subscriber drop unit 100' and instead are replaced by an internal ledge 192 that extends from at least some of the sidewalls 130, 132, 134, 136 of housing 110. The ledge 192 may be in electrical contact with the conductive ground plane 170 and may provide an improved ground connection to the printed circuit board thereof.

The present invention is not limited to the illustrated embodiments discussed above; rather, these embodiments are intended to fully and completely disclose the invention to those skilled in this art. In the drawings, like numbers refer to like elements throughout.

In the description above, spatially relative terms, such as "top," "bottom," "side," "upper," "lower" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "under" or "beneath" other elements or features would then be oriented "over" the other elements or features. Thus, the exemplary term "under" can encompass both an orientation of over and under. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises", "comprising", "includes" and/or "including" when used in this specification, specify the presence of stated features, integers, steps, operations, elements, and/or components, but do not preclude the presence or addition of one or more other features, integers, steps, operations, elements, components, and/or groups thereof.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between", "adjacent" versus "directly adjacent", etc.).

All of the above-described embodiments may be combined in any way to provide a plurality of additional embodiments.

The foregoing is illustrative of the present invention and is not to be construed as limiting thereof. Although exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. The invention is defined by the following claims, with equivalents of the claims to be included therein.

That which is claimed is:

1. A radio frequency ("RF") subscriber drop unit, comprising:
a housing having an input port and an output port;
a printed circuit board mounted in an interior of the housing, the printed circuit board including a dielectric layer, a wiring layer that includes conductive wirings that comprise at least part of a communications path between the input port and the output port that is on a first face of the dielectric layer, and a ground plane layer that includes a conductive ground plane that is on a second face of the dielectric layer; and
a ledge extending from respective inner surfaces of at least first and second side walls of the housing, the ledge being electrically connected to the ground plane, wherein the conductive ground plane comprises a first conductive ground plane, the printed circuit board further comprising a second conductive ground plane that is part of the wiring layer.

2. The RF subscriber drop unit of claim 1, further comprising at least one projection extending from an inner surface of a top wall of the housing, wherein the at least one projection is electrically connected to the ground plane.

3. The RF subscriber drop unit of claim 1, wherein the housing includes a top wall and a plurality of sidewalls that define the interior of the housing, the RF subscriber drop unit further comprising a cover that is mounted to the sidewalls opposite the top wall to enclose the interior, wherein the wiring layer of the printed circuit board is adjacent the cover and the ground plane layer of the printed circuit board is adjacent the top wall.

4. The RF subscriber drop unit of claim 1, wherein the conductive ground plane is configured to reduce signal energy loss between the RF input port and the RF output port.

5. The RF subscriber drop unit of claim 1, wherein the printed circuit board is mounted on a plurality of posts that extend from an interior surface of a top wall of the housing.

6. The RF subscriber drop unit of claim 1, wherein the input port is a female coaxial connector port, and the output port is a female coaxial connector port.

7. The RF subscriber drop unit of claim 1, wherein the RF subscriber drop unit comprises a 1×2 RF splitter having an insertion loss of less than 3.5 dB at 1 GHz.

8. The RF subscriber drop unit of claim 1, wherein the RF subscriber drop unit comprises a RF signal amplifier.

9. The RF subscriber drop unit of claim 1, wherein the housing includes a mounting bracket and a ground block.

10. A radio frequency ("RF") subscriber drop unit, comprising:
a housing having an input port and an output port;
a printed circuit board mounted in an interior of the housing, the printed circuit board including a dielectric layer, a wiring layer that includes conductive wirings that comprise at least part of a communications path between the input port and the output port that is on a first face of the dielectric layer, and a ground plane layer that includes a conductive ground plane that is on a second face of the dielectric layer; and
at least one of:
a ledge extending from an inner surface of at least a first side wall of the housing, the ledge being electrically connected to the ground plane; and
at least one projection extending from an inner surface of the housing, wherein the at least one projection is electrically connected to the ground plane,
wherein the RF subscriber drop unit comprises a 1×2 RF splitter having an insertion loss of less than 3.5 dB at 1 GHz.

11. A passive RF subscriber drop unit, comprising:
a housing having an input port and an output port;
a printed circuit board mounted in an interior of the housing, the printed circuit board including a first face that has a plurality of circuit elements mounted thereon, at least one of which is part of a conductive path that extends from the input port to the output port, and a second face that includes a conductive ground plane; and a plurality of projections extending from a top wall of the housing that extend through respective ones of a plurality of apertures in the printed circuit board, at least one of the projections being electrically connected to the conductive ground plane.

12. The passive RF subscriber drop unit of claim 11, wherein the conductive ground plane comprises one or more conductive pads that cover at least half the surface area of a ground plane layer of the printed circuit board.

13. The passive RF subscriber drop unit of claim 11, wherein the printed circuit board comprises a double-sided printed circuit board.

14. The passive RF subscriber drop unit of claim 13, wherein the conductive ground plane is positioned with respect to the conductive path to control an impedance of the conductive path.

15. The passive RF subscriber drop unit of claim 11, wherein the passive RF subscriber drop unit comprises a 1×2 RF splitter having an insertion loss of less than 3.5 dB at 1 GHz.

16. The passive RF subscriber drop unit of claim 11, wherein the conductive ground plane is a first conductive ground plane, the printed circuit board further comprising a second conductive ground plane that is part of the first face.

17. The passive RF subscriber drop unit of claim 11, wherein the input port is a female coaxial connector port, and the output port is a female coaxial connector port.

18. The passive RF subscriber drop unit of claim 11, wherein a first projection of said plurality of projections includes an internal hollow and a screw engaged within the hollow, with the screw of the first projection extending through a respective one of the plurality of apertures.

19. A radio frequency ("RF") subscriber drop unit, comprising:

a housing having a top wall and a plurality of sidewalls that define an open interior;

an input port that extends from a first of the sidewalls of the housing;

an output port that extends from a second of the sidewalls of the housing;

a printed circuit board mounted on a plurality of posts that extend downwardly from an interior face of the top wall of the housing into the open interior of the housing; and a ground wall that projects downwardly from the interior face of the top wall, the ground wall extending from the first of the sidewalls to the second of the sidewalls, wherein the ground wall is electrically connected to a conductive ground plane of the printed circuit board.

20. The RF subscriber drop unit of claim 19, wherein the printed circuit board includes a dielectric layer, a wiring layer that includes conductive wirings that comprise at least part of a communications path between the input port and the output port that is on a first face of the dielectric layer, and a ground plane layer, that includes the conductive ground plane, that is on a second face of the dielectric layer.

* * * * *